United States Patent
Kalluri et al.

[11] Patent Number: 6,081,915
[45] Date of Patent: Jun. 27, 2000

[54] METHOD AND APPARATUS FOR REDUCING THE TIME REQUIRED TO TEST AN INTEGRATED CIRCUIT USING SLEW RATE CONTROL

[75] Inventors: Seshagiri Prasad Kalluri; Rene Martin Delgado, both of Austin, Tex.

[73] Assignee: Motorola, Inc., Schaumbur, Ill.

[21] Appl. No.: 09/050,157

[22] Filed: Mar. 30, 1998

[51] Int. Cl.[7] .................................................. G01R 31/28
[52] U.S. Cl. ...................... 714/724; 714/745; 324/503; 326/16; 326/30; 326/87; 327/108
[58] Field of Search .................................. 714/745, 724; 326/21, 27, 30, 16, 18, 62, 83, 87; 327/108, 199, 200; 324/503, 763

[56] References Cited

U.S. PATENT DOCUMENTS

| | | | |
|---|---|---|---|
| 3,868,519 | 2/1975 | Green | 327/108 |
| 4,719,369 | 1/1988 | Asan et al. | 326/30 |
| 4,761,647 | 8/1988 | Hallenbeck et al. | 340/825.22 |
| 4,857,863 | 8/1989 | Ganger et al. | 330/264 |
| 4,906,867 | 3/1990 | Petty | 326/27 |
| 5,039,874 | 8/1991 | Anderson | 307/270 |
| 5,066,858 | 11/1991 | Elings et al. | 250/307 |
| 5,162,672 | 11/1992 | McMahan et al. | 326/86 |
| 5,294,845 | 3/1994 | McMahan et al. | 326/2 |
| 5,376,848 | 12/1994 | Hanke, III et al. | 327/141 |
| 5,428,770 | 6/1995 | Garner | 714/733 |
| 5,444,402 | 8/1995 | McMahon et al. | 327/170 |
| 5,448,182 | 9/1995 | Countryman et al. | 326/30 |
| 5,629,643 | 5/1997 | Moughanni et al. | 327/199 |
| 5,870,591 | 2/1999 | Sawada | 713/500 |

Primary Examiner—Emmanuel L. Moise
Attorney, Agent, or Firm—James L. Clingan, Jr.; Susan C. Hill

[57] ABSTRACT

Method and apparatus for reducing the time required to test an integrated circuit (10) using slew rate control. Using a very slow slew rate during normal operation may reduce electromagnetic interference, while using a faster slew rate during testing may reduce the test costs. In one embodiment, terminal control circuitry (40) includes a fast test control bit (50) to select a slow slew rate during normal operation, to select a faster slew rate during functional testing, and to optionally select a variety of slew rates during a special test to more fully characterize the behavior of integrated circuit (10). In one embodiment, each pre-driver circuit (80, 81) includes a low resistance device (61, 63) which may be selectively enabled or disabled to join with capacitors (66, 67) in output driver (82) to affect the slew rate of the signal driven as an output by integrated circuit terminal (83).

25 Claims, 3 Drawing Sheets

METHOD AND APPARATUS FOR REDUCING THE TIME REQUIRED TO TEST AN INTEGRATED CIRCUIT USING SLEW RATE CONTROL

FIELD OF THE INVENTION

The present invention relates in general to testing an integrated circuit, and more particularly to a method and apparatus for reducing the time required to test an integrated circuit using slew rate control.

BACKGROUND OF THE INVENTION

In some application using integrated circuits, the electromagnetic interference generated by the integrated circuits can be a significant problem. In addition, for some applications a specific frequency of the electromagnetic interference may be more of a problem for integrated circuit terminals that switch at a very high frequency or that have very fast rise and fall times. One example of such an application is automobile control where it is very important for an integrated circuit not to interfere with the radio frequencies which will be received by the radio receiver within the automobile. In such applications, the integrated circuits may generate harmonics which may be perceived as noise by radio receiver.

DETAILED DESCRIPTION

In order to reduce the electromagnetic interference produced by an integrated circuit, it is helpful to decrease the slew rate of the signals driven by one or more of the integrated circuit terminals on the integrated circuit. The prior art has generally not tried to decrease the slew rate to reduce electromagnetic interference. Most prior art integrated circuits try to increase the switching speed of the integrated circuit terminals by a variety of approaches, including increasing the slew rate and/or performing impedance matching. However, for integrated circuit terminals that do not always require high speed it was found useful to provide an operating mode in which the slew rate of a signal transferred across the integrated circuit terminals is slowed significantly. Unfortunately, decreasing the slew rate of an integrated circuit terminal in order to reduce electromagnetic interference may cause the integrated circuit terminal to waste a significant amount of time during functional testing of the integrated circuit when electromagnetic interference is not a significant problem. It was thus important to provide integrated circuit terminals that could operate with a slow slew rate in target applications, and yet could be functionally tested in as short an amount of time as possible in order to reduce test costs. The present invention allows use of a very slow slew rate during normal operation to reduce electromagnetic interference, yet allows use of a faster slew rate during testing to reduce test costs.

The term "bus" will be used to refer to a plurality of signals or conductors which may be used to transfer one or more various types of information, such as data, addresses, control, or status. The terms "assert" and "negate" will be used when referring to the rendering of a signal, status bit, or similar apparatus into its logically true or logically false state, respectively. If the logically true state is a logic level one, the logically false state will be a logic level zero. And if the logically true state is a logic level zero, the logically false state will be a logic level one.

DESCRIPTION OF THE FIGURES

Figure 1:
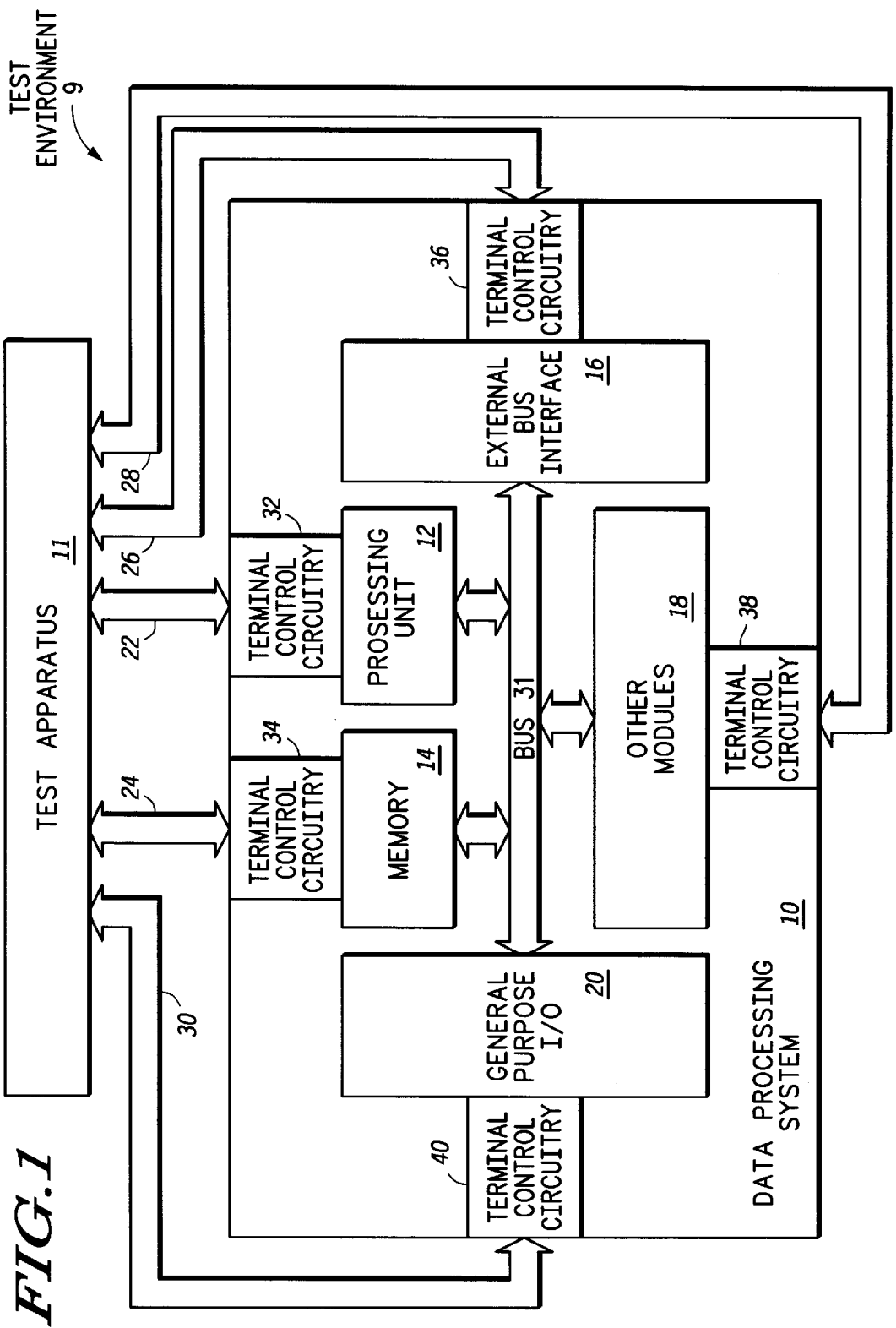
FIG. 1 illustrates, in block diagram form, a test environment in accordance with one embodiment of the present invention.

FIG. 1 illustrates one embodiment of test environment 9. In the illustrated embodiment, test environment 9 includes a data processing system 10 which is coupled to test apparatus 11 by way of conductors 22, 24, 26, 28, and 30. In alternate embodiments of the present invention, data processing system 10 may be any type of integrated circuit. In one embodiment of the present invention data processing system 10 includes processing unit 12, memory 14, external bus interface 16, other modules 18 and general purpose input/output (I/O) 20 which are all bi-directionally coupled by way of bus 31.

Still referring to FIG. 1, in one embodiment of the present invention data processing system 10 includes terminal control circuitry 32 which is coupled between processing unit 12 and conductors 22. In a similar manner, terminal control circuitry 34 is coupled between memory 14 and conductors 24, terminal control circuitry 36 is coupled between external bus interface 16 and conductors 26, terminal control circuitry 38 is coupled between other modules 18 and conductors 28, and terminal control circuitry 40 is coupled between general purpose I/O circuitry 20 and conductors 30.

Figure 2:
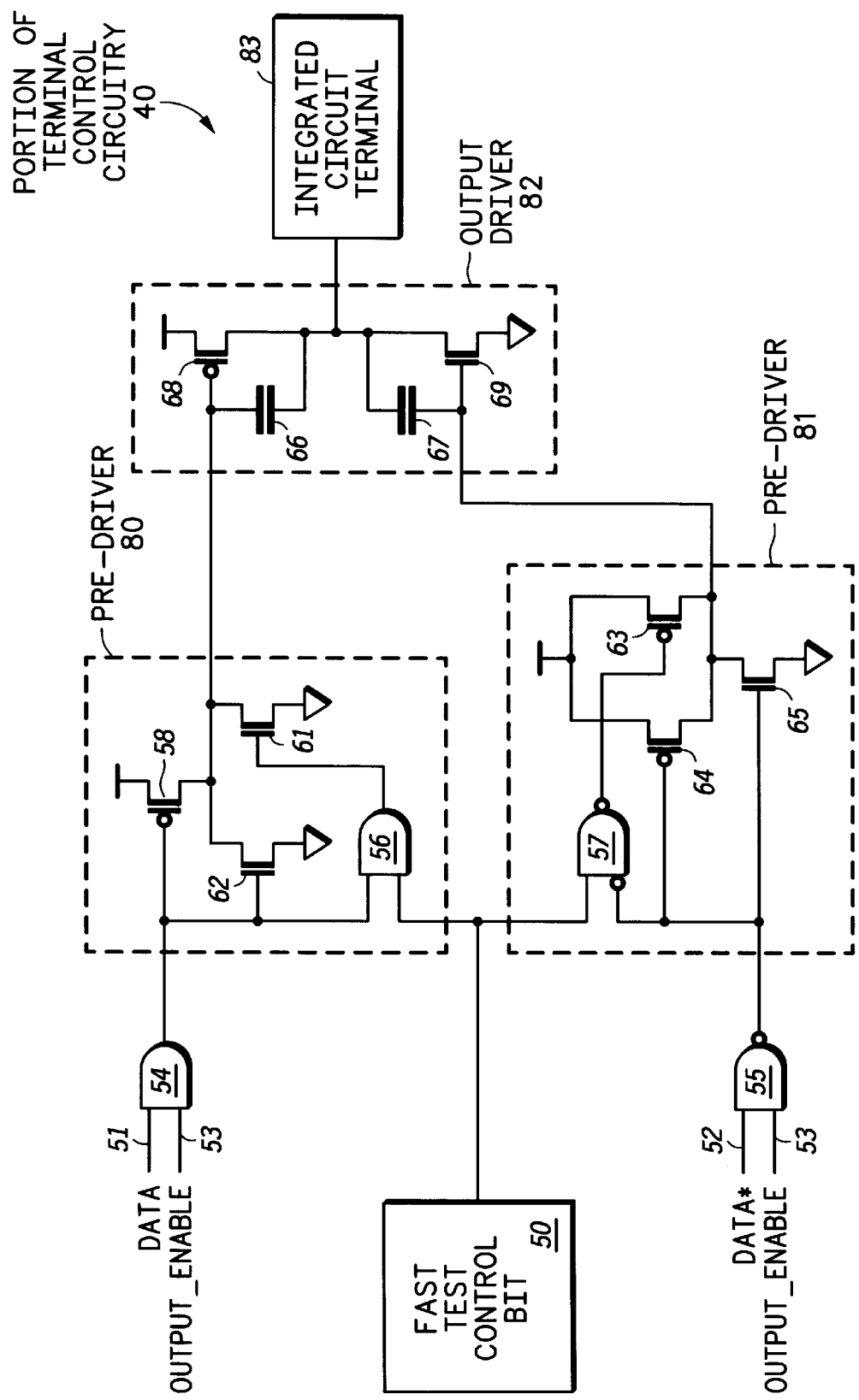
FIG. 2 illustrates, in partial block diagram form and partial schematic diagram form, a portion of terminal control circuitry of FIG. 1 in accordance with one embodiment of the present invention.

FIG. 2 illustrates a portion of terminal control circuitry 40 in accordance with one embodiment of the present invention. A data signal 51 is provided as a first input to AND gate 54. Output_enable signal 53 is provided as a second input to AND gate 54. Data* signal 52 is provided as a first input to NAND gate 55. Output_enable signal 53 is provided as a second input to NAND gate 55. The output of AND gate 54 is provided to a control electrode of a P channel field effect transistor 58, to a control electrode of an N channel field effect transistor 62, and to a first input of AND gate 56. A fast test control bit 50 is coupled to a second input of AND gate 56 and to a first input of NAND gate 57.

The output of NAND gate 55 is coupled to an inverted second input of NAND gate 57, to a control electrode of a P channel field effect transistor 64, and to a control electrode of an N channel field effect transistor 65. A first current electrode of transistor 58 is coupled to a first power supply voltage. A second current electrode of transistor 58 is coupled to a first current electrode of transistor 62 and to a first current electrode of transistor 61. A second current electrode of transistor 62 is coupled to a second power supply voltage. A second current electrode of transistor 61 is coupled to the second power supply voltage. The output of AND gate 56 is coupled to a control electrode of transistor 61. A first current electrode of transistor 64 is coupled to the first power supply voltage. The output of NAND gate 57 is coupled to a control electrode of a P channel field effect transistor 63. The first current electrode of transistor 63 is coupled to the first power supply voltage.

Still referring to FIG. 2, a second current electrode of transistor 64 and a second current electrode of transistor 63 are both coupled to a first current electrode of transistor 65. A second current electrode of transistor 65 is coupled to the second power supply voltage. The first current electrode of transistor 61 is coupled to a first terminal of capacitor 66 and to a control electrode of P channel field effect transistor 68. The first current electrode of transistor 65 is coupled to a first terminal of capacitor 67 and to a control electrode of an N channel field effect transistor 69. A first current electrode of transistor 68 is coupled to the first power supply voltage. A second current electrode of transistor 68 is coupled to a first current electrode of transistor 69. A second current electrode of transistor 69 is coupled to the second power supply voltage. A second terminal of capacitor 66 and a second terminal of capacitor 67 are each coupled to the first current electrode of transistor 69 and to an integrated circuit terminal 83. Pre-drive circuitry 80 includes transistors 58, 61, and 62 as well as AND gate 56. Pre-driver circuitry 81 includes transistors 63, 64, and 65 as well as NAND gate 57. Output driver circuitry 82 includes transistors 68 and 69 as well as capacitor 66 and 67. The output of output driver circuitry 82 is coupled to the integrated circuit terminal 83.

Figure 3:
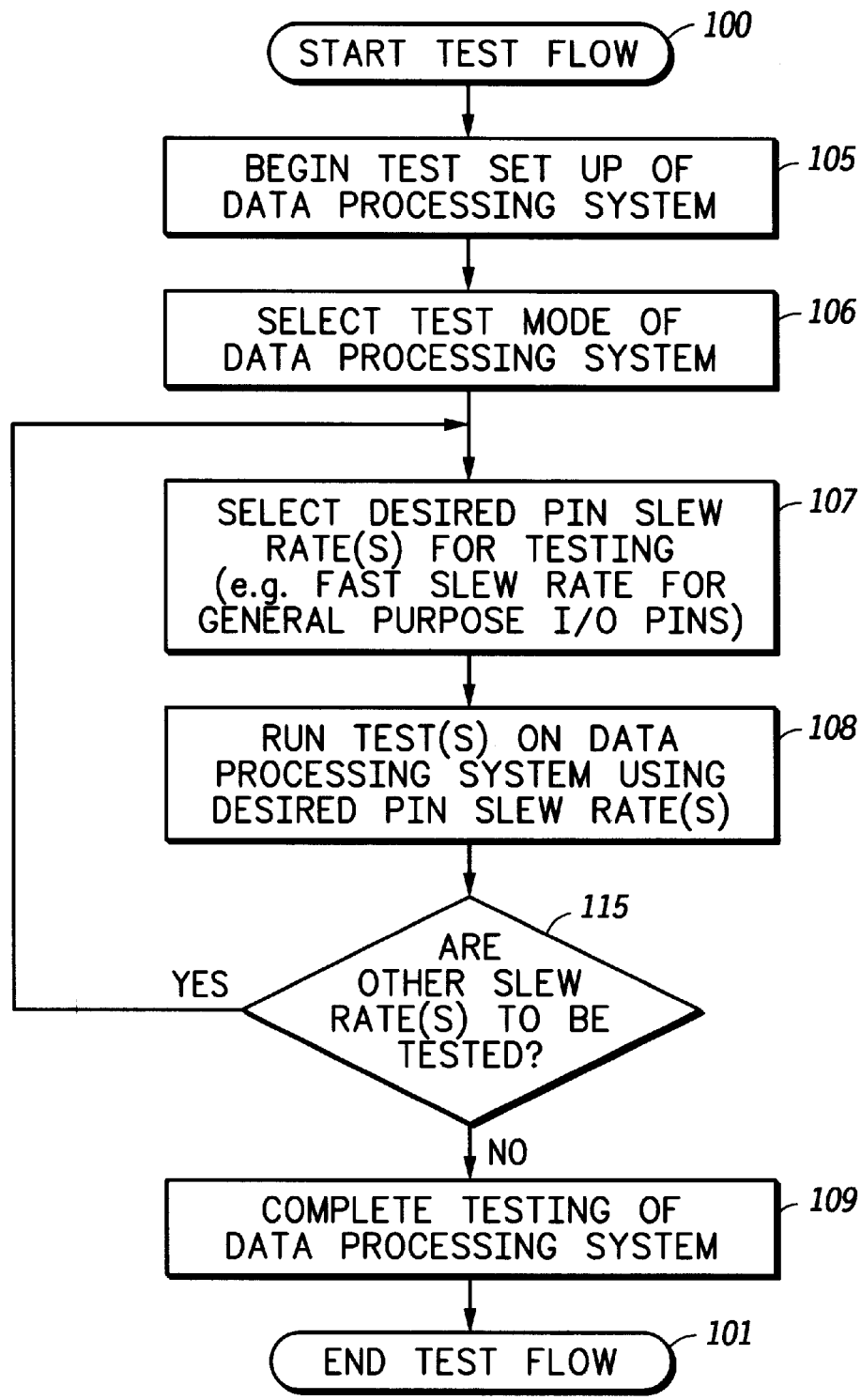
FIG. 3 illustrates, in flow diagram form, a test flow in accordance with one embodiment of the present invention.

FIG. 3 illustrates one embodiment of a test flow which may be used to test data processing system 10 of FIG. 1 by way of test apparatus 11. Oval 100 indicates the start of the test flow. Oval 101 indicates the end of the test flow. Rectangles 105–109 indicate steps performed during the test flow. Diamond 115 indicates a decision point during the test flow. Alternate embodiments of the present invention may include different or more steps as part of the test flow used to test data processing system 10 of FIG. 1.

DESCRIPTION OF OPERATION

The operation of the present invention will now be discussed. Referring to FIG. 1, data processing system 10 includes a plurality of integrated circuit terminals located within terminal control circuitry 40. In a similar fashion, terminal control circuitry 32, 34, 36, and 38 all include one or more integrated circuit terminals which are used to couple data processing system 10 to the external world, including test apparatus 11. These integrated circuit terminals may include integrated circuit bonding pads, integrated circuit pins, integrated circuit bumps, or any other mechanism that may be used to couple data processing system 10 to the external world.

Although the following discussion will relate to terminal control circuitry 40, it may also be applied to one or more of terminal control circuitries 32, 34, 36 and 38. Some applications utilizing data processing system 10 require one or more general purpose I/O terminals 20 which must generate a minimal amount of electromagnetic interference. Note however, that the present invention relates to the use of an integrated circuit terminal as an output. These integrated circuit terminals may be outputs only, or may optionally be input/outputs. In addition, the general purpose output functionality may optionally be combined with any other chip functionality (e.g. a timer signal, a serial signal, a bus signal, a debug signal, etc.). In one embodiment of the present invention the terminals in terminal control circuitry 40 may provide a slow slew rate (e.g. 90–900 nanoseconds). Alternate embodiments of the present invention may define the slow slew rate to be any slew rate or range of slew rates that is slower than the minimum slew rate of the terminals. As a result, the slow slew rate (i.e. very slow rise and fall times) produces very little electromagnetic interference. These integrated circuit terminals having a slow slew rate are used in applications where very fast transitions are not required on the integrated circuit terminals within terminal control circuitry 40.

A problem arises, however, when data processing system 10 is tested by test apparatus 11 (see FIG. 1). A significant amount of test time is required to test integrated circuit terminals that have a slow slew rate. In many test methodologies, test apparatus 11 is a very expensive piece of test equipment. Thus, it is desirable to minimize the amount of time that test apparatus 11 requires to test operational functionality of data processing system 10. For example, it may only be necessary to verify that integrated circuit terminals on data processing system 10 are in the proper logic state. For such testing it may be advantageous to increase the slew rate of selected integrated circuit terminals so that the time required to run the necessary functional test patterns is significantly reduced. Of course if characterization data is required, i.e. characterizing the actual slew rate of the integrated circuit terminals, then it may be necessary to use the slower slew rate of the integrated circuit terminals during the characterization portion of the test flow.

FIG. 2 illustrates a portion of terminal control circuitry 40 of FIG. 1. Note that the circuitry illustrated in FIG. 2 may also be used within terminal control circuitry 32, 34, 36, and 38. In one embodiment of the present invention fast test control bit 50 may be used to selectively enable or disable the slow slew rate of the signal that is driven by output driver 82 on integrated circuit terminal 83. Note that the portion of terminal control circuitry 40 illustrated in FIG. 2 illustrates only the output driver portion of terminal control circuitry 40. The optional input path portion from integrated circuit terminal 83 is not illustrated. Integrated circuit terminal 83 is coupled to conductors 30 when test apparatus 11 is testing data processing system 10.

The circuitry illustrated in FIG. 2 includes two pre-driver circuits 80 and 81. Within each of the pre-drivers 80 and 81 there are two transistors, one of which has a much higher resistance than the other. The higher resistance transistor, in conjunction with a corresponding capacitor (e.g. 66, 67) in output driver 82, can provide a slow slew rate at the integrated circuit terminal 83. Note that the slew rate is a function of the overall resistance value produced by transistors 61–64 and the overall capacitance value produced by capacitors 66 and 67. Alternate embodiments of the present invention may use any combination or series and/or parallel resistors instead of or in conjunction with transistors 61–64 to provide an overall resistance value that can be held constant or that can be varied based on the slew rate of integrated circuit terminal 83 that is desired. Similarly, alternate embodiments of the present invention may replace capacitors 66 and 67 with any number of capacitors in series or in parallel to provide an overall capacitance value that can be held constant or can be varied based on the slew rate of integrated circuit terminal 83 that is desired.

In one embodiment of the present invention, pre-driver 80 has a transistor 62 which has a high on-resistance and has a high output impedance when transistor 62 is on and conducting. As a result of this high impedance, transistor 62 produces a signal with a slow slew rate at the output of pre-driver 80. In contrast, transistor 61 within pre-driver 80 has a low on-resistance and thus a low output impedance when transistor 61 is on and conducting. As a result, transistor 61 produces a fast slew rate at the output of pre-driver 80. Note that if only transistor 62 is conducting, pre-driver 80 has a slow slew rate at the output. If only transistor 61 is on and conducting, pre-driver 80 has a fast slew rate at the output. And if both transistors 61 and 62 are on and conducting, the low impedance output of transistor 61 is overwhelming and the slew rate of the output signal driven by pre-driver 80 is fast. Although the embodiment of the present invention illustrated in FIG. 2 uses control circuitry, i.e. AND gate 56, which allows both transistor 61 and 62 to be conducting when a fast slew rate is desired, alternate embodiments of the present invention may instead allow only one of transistor 61 and 62 to be conducting at one time. For example, the circuitry illustrated in FIG. 2 allows transistor 62 to remain in the on or conducting state while transistor 61 is turned on or off, i.e. conducting or non-conducting, depending upon whether a fast or slow slew rate is desired at the output of pre-driver 80. Pre-driver 80 is then used to drive the P channel portion of output driver 82. Note that the logic value of the output of pre-driver 80 mirrors the logic value of data* signal 52.

Pre-driver circuit 81 functions in a similar manner to pre-driver circuit 80. The on-resistance of transistor 64 is very high in comparison to the on-resistance of transistor 63. As a result if transistor 63 is on and conducting, the slew rate of the output of pre-driver 81 is fast regardless of whether transistor 64 is conducting or not. However, if transistor 64 is on and conducting, and transistor 63 is off and not conducting, then the slew rate of the output of pre-driver 81 will be slow. Note that the logic state of the output of pre-driver circuit 81 mirrors the logic state of data signal 51.

In the particular embodiment of the present invention illustrated in FIG. 2, output_enable signal 53 is used as an enable signal to enable pre-driver circuit 80 and pre-driver circuit 81. Output_enable signal 53 indirectly controls output driver 82. When output enable signal 53 is negated, pre-driver circuit 80 drives a logic levels one which causes transistor 68 to be non-conducting. Similarly when output enable signal 53 is negated, pre-driver circuit 81 drives a logic level zero which causes transistor 69 to be non-conducting. With both transistors 68 and 69 being non-conductive, output driver 82 is in a high impedance state and is not driving an output. On the other hand, when output_enable signal 53 is asserted, the value of data signal 51 is provided as an input to both pre-driver circuit 80 and pre-driver circuit 81. The fast test control bit 50 is then used to select whether transistors 61 and 63 are conducting or non-conducting. Note that only one of transistors 62 and 64 will be conducting at one time based upon the logic level of data signal 51. Note that the logic level of data signal 51 is always complementary to the logic level of data* signal 52. Like transistors 62 and 64, only one of transistors 61 and 63 will be selected to be conducting at one time based on the logic level of data signal 51 and the value of the fast test control bit 50 provided as inputs to AND gate 56 and NAND gate 57. Note that if a slow slew rate is selected, neither transistor 61 nor transistor 63 will be conducting. Note that the logic level driven by pre-driver circuit 80 and pre-driver circuit 81 are always the same logic level. As a result, only one of transistors 68 and 69 in output driver circuit 82 will be conducting at any one time.

Capacitors 66 and 67 within output driver 82 are used to provide a feedback to the input of transistors 68 and 69 respectively in order to reduce the slew rate of the signal provided as the output from output driver 82. Note that the embodiment of the present invention illustrated in FIG. 2 uses fixed capacitor value 66 and 67 which are always used to provide a feedback path to slow the slew rate, alternate embodiments of the present invention may selectively remove this capacitance, (i.e. capacitors 66 and 67) or may vary the capacitance using a variety of control circuitry. For example, if a very fast slew rate is required at the output of output driver 82, it may be desirable to effectively remove capacitor 66 and 67 by means of control logic such as transmission gates or pass transistors (not shown). The functional removal of transistor 66 and 67 from output driver 82 will increase the slew rate of the signal driven by output driver 82. Thus, in effect, the control mechanism used to select between the resistance value of transistors 61 and 62 in pre-driver 80 and the resistance value of transistors 63 and 64 in pre-driver circuit 81 may similarly be applied to select different capacitance values for the capacitors provided in feedback paths to transistor 68 and 69. Note that increasing the capacitance of capacitors 66 and 67 decreases the slew rate of the output signal provided by output driver 82. In one embodiment of the present invention the capacitor values 66 and 67 are approximately the same (e.g. 0.3 picofarads). Alternate embodiments of the present invention may use different values for capacitors 66 and 67.

In one embodiment of the present invention fast test control bit 50 is implemented by way of an integrated circuit register that may be read or written by way of processing unit 12 (see FIG. 1). Alternate embodiments of the present invention may implement fast test control bit 50 by way of one or more integrated circuit terminals (e.g. an integrated circuit terminal located within terminal control circuitry 36). In yet other embodiments of the present invention, fast test control bit 50 may be a storage latch circuit located anywhere within data processing system 10. Fast test control bit 50 may be a write once bit that can be written only once out of reset. Fast test control bit 50 may be stored in a non-volatile memory cell or may be stored in any other type of storage circuit. Note that the slew rate of output driver circuit 82 determines the slew rate driven external to data processing system 10 by way of integrated circuit terminal 83.

In some embodiments of the present invention fast test control bit 50 may be used to control one integrated circuit terminal 83. In alternate embodiments of the present invention one fast test control bit 50 may be used to control the slew rate of a plurality of integrated circuit terminals (e.g. a plurality of integrated circuit terminals 83). For example, one fast test control bit 50 may be used to control the slew rate of all the integrated circuit terminals located within terminal control circuitry 40. In alternate embodiments of the present invention, fast test control bit 50 may be used to control the slew rate of all the integrated circuit terminals included within terminal control circuitries 32, 34, 36, 38, and 40. Note that terminal control circuitries 32, 34, 36, 38, and 40 may be located anywhere within data processing system 10. For example, terminal control circuitries 32, 34, 36, 38, and 40 may all be located within external bus interface 16.

Referring now to FIG. 3, FIG. 3 illustrates one embodiment of a test flow which may be used to test the data processing system 10 illustrated in FIG. 1. In one embodiment of the present invention data processing system 10 is formed on a single integrated circuit and test apparatus 11 is used to test data processing system 10. Referring to FIG. 3, the first step in the test flow, rectangle 105, is to begin the test set up of the data processing system. The flow then continues to selecting the test mode of the data processing system in rectangle 106. Note that alternate embodiments of the present invention may not need to select a test mode of the data processing system in order to test the data processing system. In other words, data processing system 10 may be tested in its normal operating mode rather than in a special test mode. Alternately, it may be desirable to test data processing system 10 in both its normal operating mode and in a special test mode.

The flow then continues at rectangle 107 where the desired pin slew rates for testing are selected. Note that the slew rates for the various integrated circuit terminals may be different or the same based upon the particular test that is being performed. One example of a desired slew rate that may be selected is that all general purpose I/O integrated circuit terminals may be selected to have a fast slew rate so that the test time required by test apparatus 11 to test data processing system 10 is minimized. In fact for some embodiments of the present invention, it may be desirable to select a slew rate for all integrated circuit terminals that is as fast as possible to conduct the test required so that the test time required by test apparatus 11 is minimized. The flow then continues to rectangle 108 where the tests on data processing system 10 using the desired pin slew rates are run. The flow then continues to decision diamond 115 where the decision is made as to whether other slew rates of the integrated circuit terminals need to be tested. If other slew rates of the integrated circuit terminals need to be tested, the flow continues at rectangle 107 where the desired new slew rates are selected by way of one or more fast test control bits 50 (see FIG. 2). If there are no other slew rates to be tested, the flow continues at rectangle 109 where the testing of data processing system 10 is completed.

While the present invention has been illustrated and described with reference to specific embodiments, further modifications and improvements will occur to those skilled in the art. It is to be understood, therefore, that this invention is not limited to the particular forms illustrated and that the appended claims cover all modifications that do not depart from the spirit and scope of this invention.

What is claimed is:

1. A method of testing internal circuitry of an integrated circuit at a faster rate than is possible with the integrated circuit, which has output circuits with a slew rate which is a sufficiently slow slew rate to avoid adverse effects of electromagnetic interference, when these output circuits are used for providing an output during the testing of the internal circuitry, comprising the steps of:
    changing the slew rate of the output circuits to a faster slew rate than the sufficiently slow slew rate; and
    testing the internal circuitry at the faster rate using the output circuits at the faster slew rate.

2. The method of claim 1 wherein the faster slew rate is at least a factor of ten faster than the sufficiently slow slew rate.

3. The method of claim 1 wherein the faster slew rate is at least a factor of fifty faster than the sufficiently slow slew rate.

4. The method of claim 1 wherein:
    the sufficiently slow slew rate limits how fast the internal circuitry can be tested to a first rate of testing; and
    the internal circuitry is tested at a second rate, said second rate being at least ten times faster than said first rate.

5. The method of claim 4, wherein the second rate is at least fifty times faster than the first rate.

6. A method of testing an integrated circuit having internal circuitry which is tested with a plurality of patterns through an output circuit which has a speed of operation which is a normal speed of operation, comprising the steps of:
    changing the speed of operation of the output circuit to a higher speed of operation than the normal speed of operation; and
    testing the internal circuitry with the plurality of patterns using the output circuit at the higher speed of operation.

7. The method of claim 6 wherein the higher speed of operation is at least ten times faster than the normal speed of operation.

8. The method of claim 6 wherein the higher speed of operation is at least fifty times faster than the normal speed of operation.

9. The method of claim 6 wherein the output circuit comprises:
    an output driver for receiving a first input signal and a second input signal and providing an output signal;
    a first pre-driver circuit for providing the first input signal which is selectively provided between one of a first output impedance and a second output impedance in response to a control bit; and
    a second pre-driver circuit for providing the second input signal which is selectively provided between one of a third output impedance and a fourth output impedance in response to the control bit.

10. An output circuit for providing an output signal, comprising:
    an output driver which receives a first input signal, receives a second input signal, and provides the output signal;
    a first pre-driver circuit which provides the first input signal which is selectively provided at one of a first output impedance and a second output impedance in response to a control bit; and
    a second pre-driver circuit which provides the second input signal which is selectively provided at one of a third output impedance and a fourth output impedance in response to the control bit.

11. The output circuit of claim 10, wherein the first pre-driver circuit comprises:
    a logic circuit for providing a first control signal in response to a data signal and the control bit;
    a first transistor for providing the first input signal on a current electrode thereof in response to the data signal; and
    a second transistor for providing the first input signal on a current electrode thereof in response to the first control signal.

12. The output circuit of claim 11, wherein the first transistor has a first impedance and the second transistor has a second impedance, the first impedance is greater than the second impedance.

13. The output circuit of claim 12, wherein the first impedance is at least ten times greater than the second impedance.

14. The output circuit of claim 12, wherein the first impedance is at least fifty times greater than the second impedance.

15. The output circuit of claim 10, wherein
    the output driver is further characterized as providing the output signal at a first output terminal, receiving the first input signal on a first input terminal, receiving the second input signal on a second input terminal, and having a first capacitor coupled between the first output terminal and the first input terminal.

16. A method of operating an output circuit having an output driver which provides an output signal at an output terminal, receives a first input signal on a first input terminal, receives a second input signal on a second input terminal, and has a first capacitor coupled between the output terminal and the first input terminal, comprising the steps of:
    providing the first input signal at a first impedance when a control bit is in a first logic state; and
    providing the first input signal at a second impedance when the control bit is in a second logic state.

17. The method of claim 16, wherein the first impedance is at least ten times greater than the second impedance.

18. The method of claim 17, wherein the first impedance is at least fifty times greater than the second impedance.

19. The method of claim 16, wherein the output circuit further comprises a second capacitor coupled between the output terminal and the second input terminal, further comprising the steps of:

provides the second input signal at a third impedance when the control bit is in the first logic state; and providing the second input signal at a fourth impedance when the control bit is in the second logic state.

20. A test configuration comprising:

an integrated circuit having;

internal circuitry to be tested; and output circuits required for use in testing the internal circuitry in which said output circuits have a first mode which has a sufficiently slow slew rate to avoid adverse effects of electromagnetic interference and a second mode which has a fast rate for use when testing the internal circuitry; and a test apparatus which places the output circuits in the second mode and tests the internal circuitry while the output circuits are in the second mode.

21. The test configuration of claim 20 wherein the first mode of operation limits how fast the internal circuitry can be tested to a first rate of testing.

22. The test configuration of claim 21, wherein the test apparatus tests the internal circuitry at a second rate, said second rate being faster than said first rate.

23. The test configuration of claim 22, wherein the second rate is at least ten times faster than the first rate.

24. A test configuration comprising:

an integrated circuit having internal circuitry which is tested with a pattern through an output circuit which operates at a normal speed of operation and switches to a faster speed of operation in response to a control bit; and a test apparatus which sets the control bit to cause the output circuit to operate at the faster speed of operation and which tests the internal circuitry with the pattern.

25. A method of testing an integrated circuit having internal circuitry which is tested with a pattern through an output circuit which has a speed of operation which is a normal speed of operation through an output driver coupled to a first pre-driver and a second pre-driver, comprising the steps of:

changing the speed of operation of the output circuit to a higher speed of operation than the normal speed of operation by changing an output impedance of the first pre-driver from a first output impedance to a second output impedance, wherein the first output impedance is at least ten times greater than the second output impedance; and testing the internal circuitry with the pattern using the output circuit at the higher speed of operation.

* * * * *